United States Patent [19]
Chen et al.

[11] Patent Number: 5,834,377
[45] Date of Patent: Nov. 10, 1998

[54] IN SITU METHOD FOR CMP ENDPOINT DETECTION

[75] Inventors: Lai-Juh Chen, Hsinchu; Hsueh-Chung Chen, Taipei, both of Taiwan

[73] Assignee: Industrial Technology Research Institute, Hsin-Chu, Taiwan

[21] Appl. No.: 826,711

[22] Filed: Apr. 7, 1997

[51] Int. Cl.[6] .................................................. H01L 21/461
[52] U.S. Cl. ............................ 438/693; 438/692; 451/21
[58] Field of Search ................................... 438/8, 16, 692, 438/693; 216/85, 88, 89, 99; 451/21, 290, 288, 287

[56] References Cited

U.S. PATENT DOCUMENTS

| | | | |
|---|---|---|---|
| 5,439,551 | 8/1995 | Meikle et al. | 156/626.1 |
| 5,483,568 | 1/1996 | Yano et al. | 378/44 |
| 5,597,442 | 1/1997 | Chen et al. | 438/8 |
| 5,643,050 | 7/1997 | Chen | 451/10 |
| 5,647,952 | 7/1997 | Chen | 216/88 |

*Primary Examiner*—R. Bruce Breneman
*Assistant Examiner*—Thomas W. Weingart
*Attorney, Agent, or Firm*—George O. Saile; Stephen B. Ackerman

[57] ABSTRACT

Several quantities related to pad wear during chemical mechanical polishing have been improved by measuring the emissivity of the pad within the annulus of wear. This emissivity value is shown to relate directly to the amount of wear in the pad and is used to control the pressure on a conditioner that is employed to compensate for pad wear. By using multiple conditioners, each of which presses on the pad with a force that is related to the pad emissivity in its annulus of wear, the uniformity of material removal, both in time and space, is improved.

16 Claims, 5 Drawing Sheets

IN SITU METHOD FOR CMP ENDPOINT DETECTION

BACKGROUND OF THE INVENTION (1) Field of the Invention

The invention relates to the general field of chemical mechanical polishing with particular reference to wear of the polishing pad.

(2) Description of the Prior Art

In integrated circuit-technology, the removal of various layers is usually accomplished through use of liquid or gaseous etchants. In these cases, the reaction products are fluids that are readily removed from the reaction site so that etching can proceed at a uniform rate. In certain cases, however, the reaction products are insoluble solids that are, at best, hard to remove. At worst, such etchants serve only to undermine, or weaken, the layer's integrity near the surface and, in the absence of any other action, are thus quite ineffective as etchants.

In etching situations of this sort, mechanical assistance in the form of a slurry comprising an abrasive powder suspended in a suitable liquid medium (such as the etchant itself) can be used to complement the action of the chemical etchant. This technique for removing material through a combination of chemical and mechanical means is referred to as chemical mechanical (chem. mech.) Polishing (CMP).

CMP also makes possible the controlled removal of material along a planar etch front, unlike pure fluid etches where the etch front tends to follow the contours of the original surface. CMP is therefore widely used for the planarization of integrated circuits. CMP is implemented by pressing the surface to be etched against a pad while both are rotating. Such a pad must be capable of holding the slurry in place during polishing. It must also be soft so that it does not scratch the substrate while it is pressed against it. Accordingly, pads are made from soft, porous material such as urethane impregnated polyester felt obtainable from, for example, the Rodel Corp. of Phoenix Ariz. or from the CABOT Corp. of El Dorado Hills, Calif.

A feature of the CMP pads is that their top surface (the one that will hold the slurry during polishing) contains many deep, vertically oriented hollow fibrils or tubules. These fibrils, while being capable of holding substantial amounts of slurry, are also very flexible and so offer little or no resistance to a substrate that is moving over them.

A schematic cross-section of a polishing pad of the type described above is shown in FIG. 1. Substrate 14 (typically a silicon wafer) is shown pressed against the top surface of pad 13 while being moved in a direction symbolised by arrow 10. As can be seen, tendrils, such as 11, cover the top surface and have hollow interiors (such as 12) wherein slurry can be held until it gets squeezed out and brought to bear against 14 as it slides past. Once 14 has gone by the tendrils should, hopefully, resume their vertical orientation so that they can be refilled with slurry.

The structure seen in FIG. 1 performs as described when it is new but, over time, the repeated compression of the tendrils (as seen in the area directly below 14) causes them to hug the surface of 13 rather than snapping back to a vertical orientation. Under these conditions, the rate of material removal during polishing goes down and, since different parts of the pad's surface flatten out at different rates, the degree of non-uniformity of material removal across the substrate's surface also begins to increase.

Both these effects are illustrated in FIG. 2 which follows both quantities for a series of silicon wafers that were polished in succession on the same pad. Curve 21 shows how the relative removal rate has dropped by almost 20% after 45 wafers have been polished. Curve 22 follows the on wafer uniformity (defined as $(T_{max-Tmin})/2 \times T_{avg}$ where $T_{max}$ and $T_{min}$ are the max and min measured thicknesses and $T_{avg}$ the average thickness) which can be seen to have decreased from about 8 to about 4 after 45 wafers have been polished.

In order to reduce effects of the type shown in FIG. 2, it has been our practice to press a conditioner in the form of a disk, similar in size to the substrate, against the surface of the pad while polishing is taking place. This disk has a rough surface and its function is to disturb the surface of the pad so that the tendrils are returned to their upright positions. Typically, the conditioner is a diamond wheel, diamond being suitable because it will not easily be removed by the polishing action of the slurry.

A plan view of this arrangement is shown in FIG. 3a, with a cross-section through 3b–3b' being seen in FIG. 3b. Silicon wafer 32 lies on polishing pad 31, separated from it by a thin layer of slurry 36. Wafer 32 is positioned so as not to overlie the center of rotation 34 so that, as the pad rotates beneath wafer 32, annular region 35 (bounded by concentric dotted circles 37 and 38) is formed and represents that part of the pad that is involved in the polishing process. Conditioner 33 is located on area 35 across from substrate 32 and, as discussed above, serves to restore flattened tendrils to a more upright position.

As the pad gets used, the depth of region 35 gradually increases and it becomes necessary to press down harder on the conditioner for it to be as effective as when the pad was new. In our previous methodology we could only guess at the extent to which pad 35 had become worn so, on an empirical basis, the pressure on conditioner 33 was increased, for example from 0.2 psi (pounds per square inch) to 0.4 psi, about midway through the polishing process. To decide whether or not to replace a pad, on the assumption that it had reached the end of its useful life, it had to be taken off-line and the depth of region 35 had to be measured directly.

SUMMARY OF THE INVENTION

It has been an object of the present invention to provide an in-situ method for monitoring wear in a CMP pad.

Another object of the present invention has been to provide a method for maintaining a constant material removal rate for a given pad over its useful lifetime.

A still further object has been to provide a method for improving the uniformity of material removal during CMP over the life of the pad.

These objects have been achieved by measuring the emissivity of the pad within the annulus of wear. This emissivity value is shown to relate directly to the amount of wear in the pad and is used to control the pressure on a conditioner that is employed to compensate for pad wear. By using multiple conditioners, each of which presses on the pad with a force that is related to the pad emissivity in its annulus of wear, the uniformity of material removal, both in time and space, is improved.

BRIEF DESCRIPTION OF THE DRAWINGS

FIG. 3b is a cross-section through FIG. 3a.

FIG. 8b is a cross-section through FIG. 8a.

DESCRIPTION OF THE PREFERRED EMBODIMENTS

As discussed above, no in-situ method for assessing the state of our polishing pads was known to us prior to the invention which we will now describe below.

As we observed how our polishing pads gradually wore away, it was noticed that a slight darkening of the active (annular) area was occurring. Investigation of this phenomenon confirmed that, with wear, the emissivity of the pads was increasing. For an opaque body, emissivity increases as reflectivity decreases. As the lengths of the tendrils grew (following repeated treatments by the conditioner) so did the probability that light incident on the pad would be trapped within it and be unable to re-emerge. This effect correlated with the emissivity of the pad.

Figure 1:
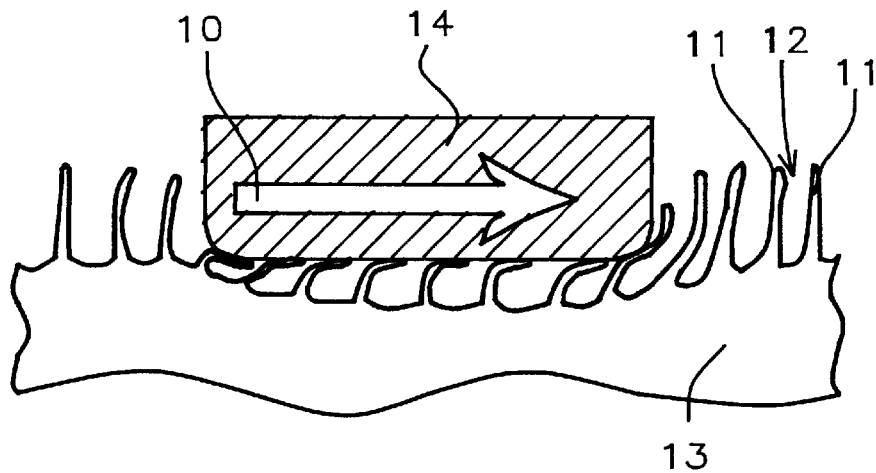
FIG. 1 shows a cross-section of a pad that is being used for chemical mechanical polishing.
Figure 2:
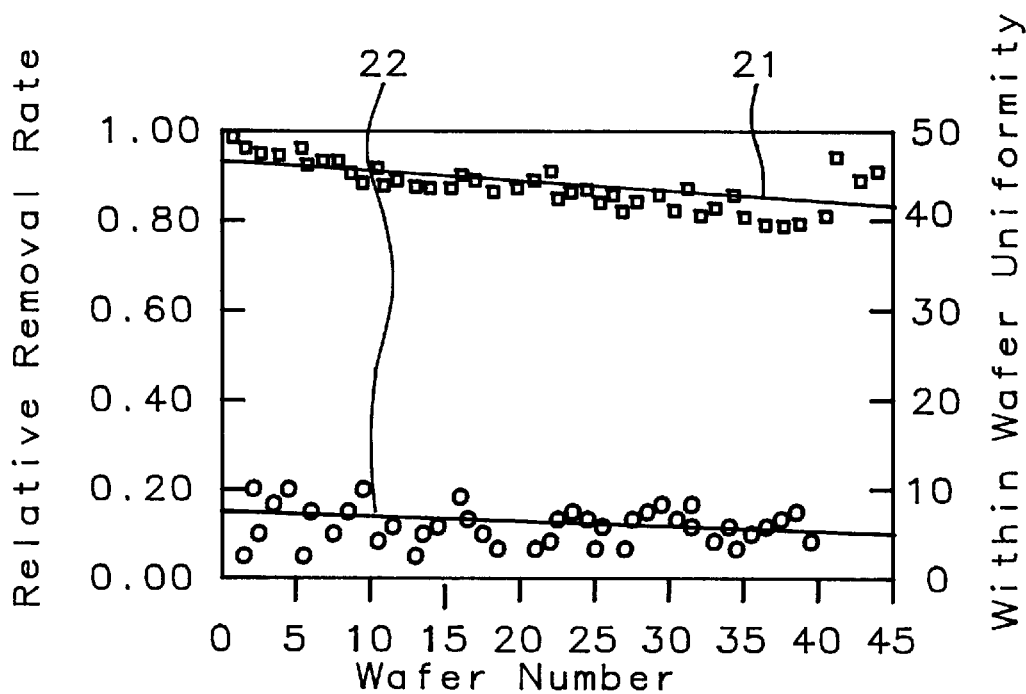
FIG. 2 shows how material removal rate and uniformity both decrease as more wafers are processed by a given pad.
Figure 3A:
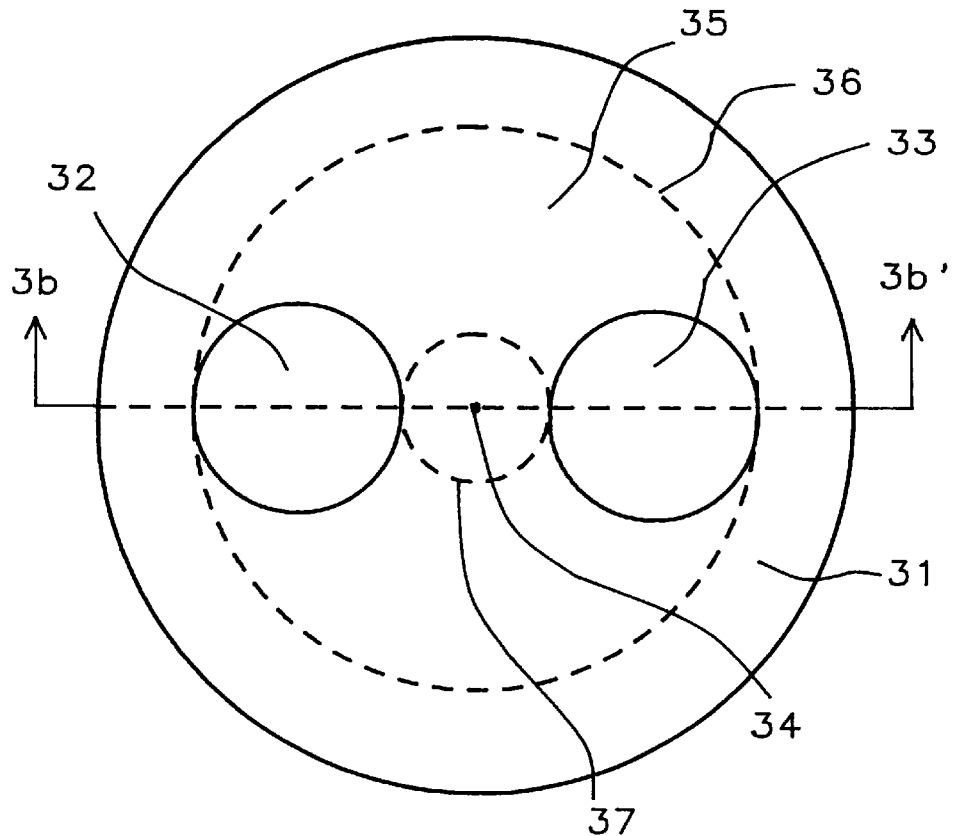
FIG. 3a is a plan view of polishing pad on which are located a silicon wafer and a conditioner.
Figure 3B:
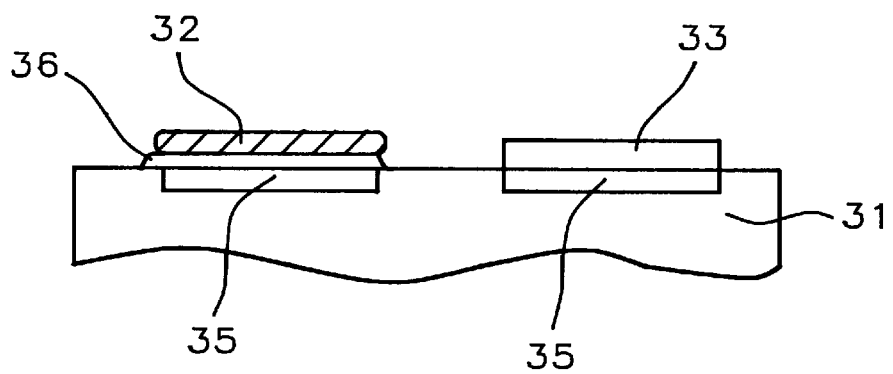
Figure 4:
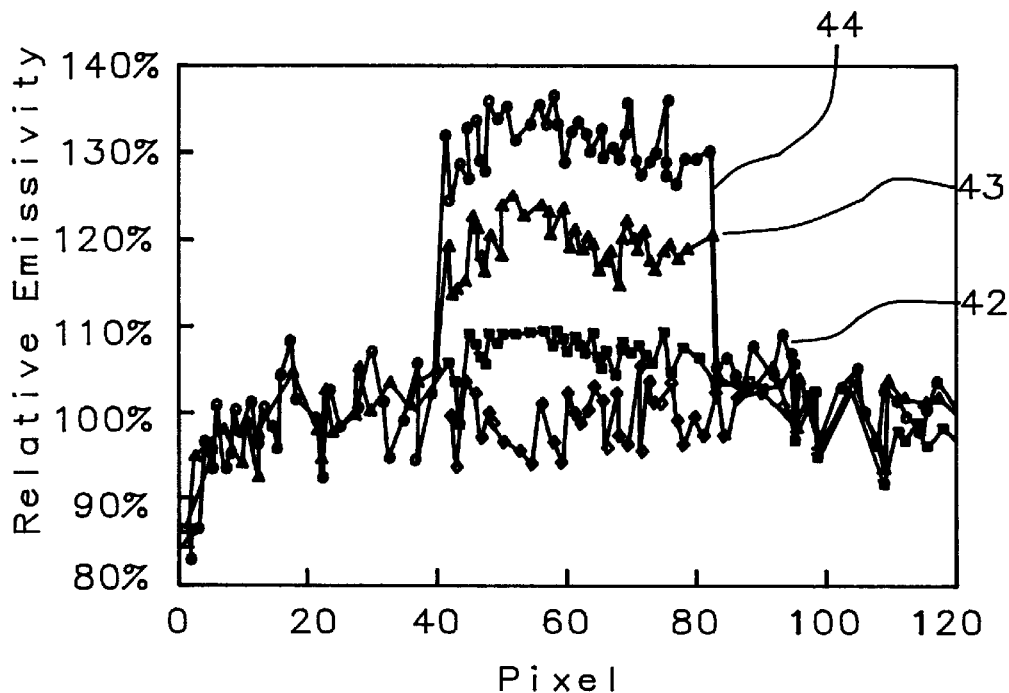
FIG. 4 is a curve showing how the emissivity of the pad's surface varies both across the surface and with time.

Referring now to FIG. 4, we show several curves of relative emissivity measured while moving across a polishing pad, each pixel referring to the small area whose emissivity was actually measured. The greater the pixel number, the further from the center of rotation of the pad. The parts of the pad denoted as pixels 0–40 and 80–120 were outside the wear annulus (region 35 in FIG. 3) whereas pixels 40–80 were inside it. Curve 41 is for a pad that has never been used, curve 42 is for an essentially new pad that has been used to polish only a few wafers, curve 43 is for a pad that is about half way through its expected life (about 100 wafers polished), and curve 44 is for a pad at the end of its life (about 200 wafers polished).

Figure 5:
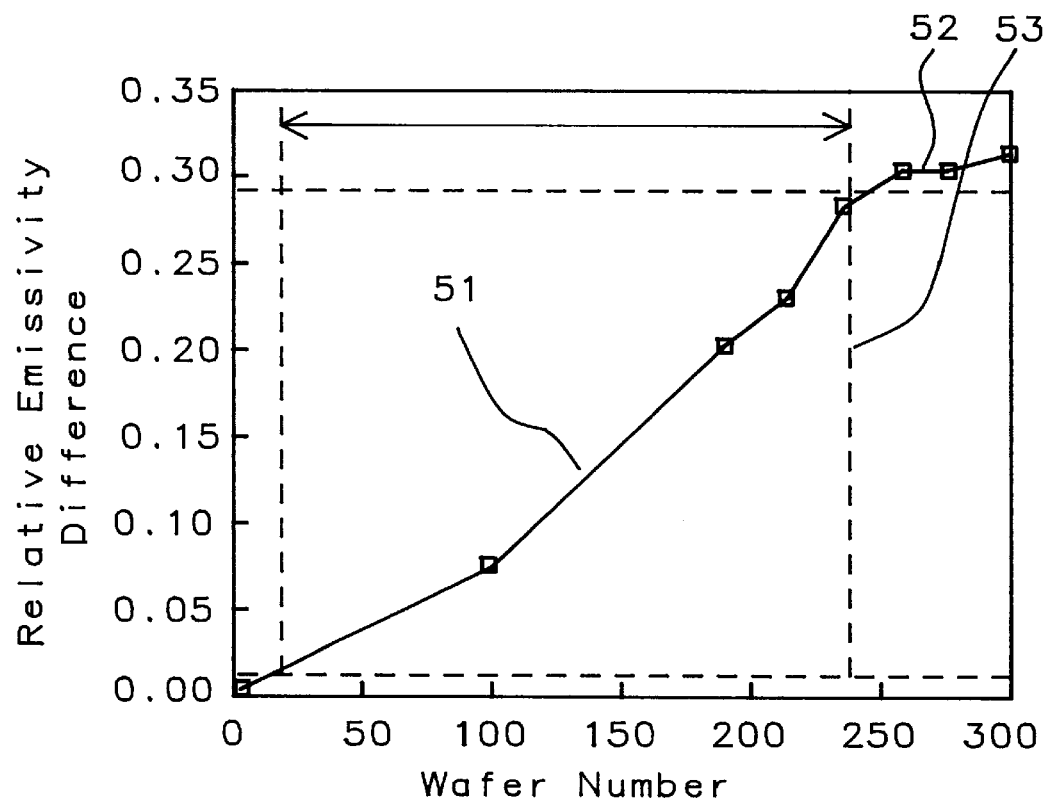
FIG. 5 is a plot of emissivity of the pad's surface as a function of the number of wafers that have been processed.

A different view of the data shown in FIG. 4 is presented in FIG. 5. The relative emissivity in the annular area for a series of wafers (less the relative emissivity at the start) is plotted for 300 wafers that were successively polished on the same pad. As can be seen, in curve 51 the emissivity rises almost linearly with increasing wafer number (corresponding to increasing pad wear). A distinct break in the curve occurs at about wafer 240 when, as seen in curve 52, the slope of the curve drops abruptly, indicating that the polishing pad was completely worn out.

Thus, by following the emissivity of one or more areas inside the annulus of wear, the rate at which a polishing pad is wearing can be monitored and the pad can be changed when its useful life is accurately known to be ending. It is important to note that this is an in-situ technique, there being no need to remove the pad in order to make measurements such as those presented in FIG. 5. Briefly, the emissivity is measured by irradiating an area (about 1 mm$^2$) with white light, usually at an angle of incidence of about 45°, though this is not critical. The intensity of light that is non-specularly reflected from the surface is measured by a photo detector and compared with that from a standard black body. Currently we have found it convenient to stop rotation of the pad for one or two minutes while the emissivity is being measured, but this is not an inherent requirement of the method.

As indicated earlier, as the pad wears out more pressure needs to be applied to the conditioner for it to remain effective. The change in pressure was effected, on an arbitrary basis, midway through the expected life of the pad. This returned the steadily dropping polish rate back to its initial value. To be preferred is a way to constantly adjust the pressure on the conditioner (in practice a diamond wheel) in response to wear in the pad, thereby maintaining a constant polishing rate throughout the life of the pad.

Figure 6:
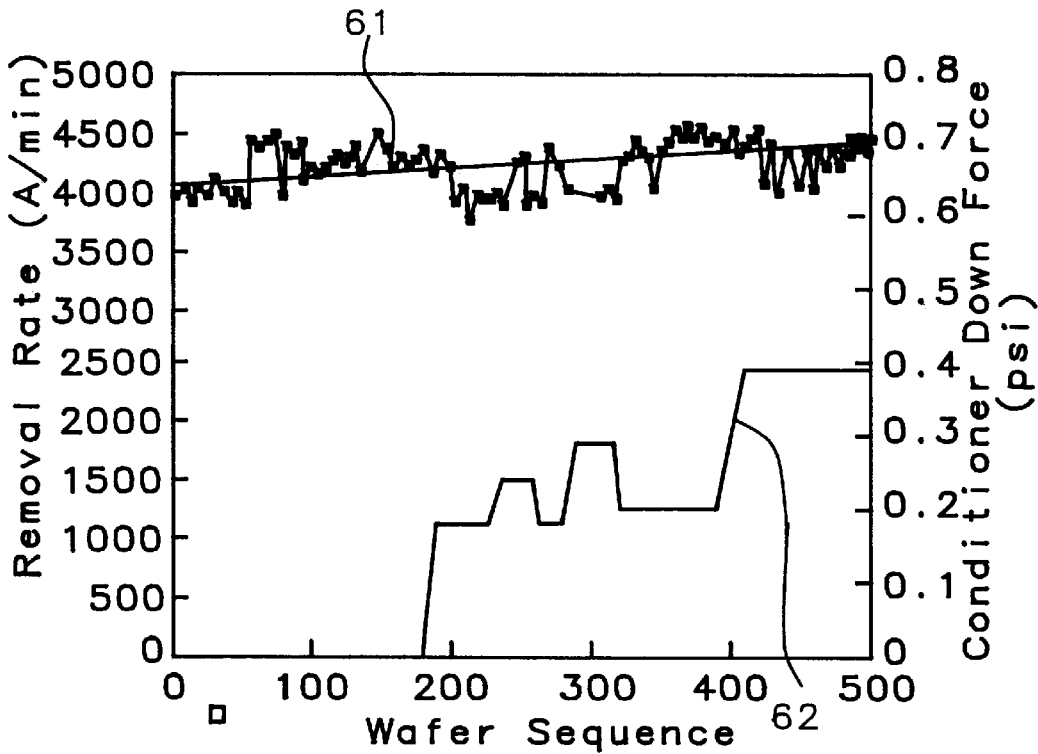
FIG. 6 shows how a constant removal rate can be achieved by varying the pressure applied to the conditioner.

In FIG. 6 we show the effect on the polishing (removal) rate when the pressure (force) on the conditioner is adjusted as needed. Curve 62 shows how the pressure on the conditioner varied, from a low of 0 psi for the first 185 wafers to a high of 0.4 psi for the last 100 wafers, for a total of 500 wafers. The effects of this regular readjustment are reflected in the near constant removal rate plotted in curve 61. To determine what pressure to apply to the conditioner, emissivity was measured as described above and the change in emissivity from the starting value (new pad) was used to control the pressure, based on the previously determined relationship of emissivity to pressure.

Figure 7:
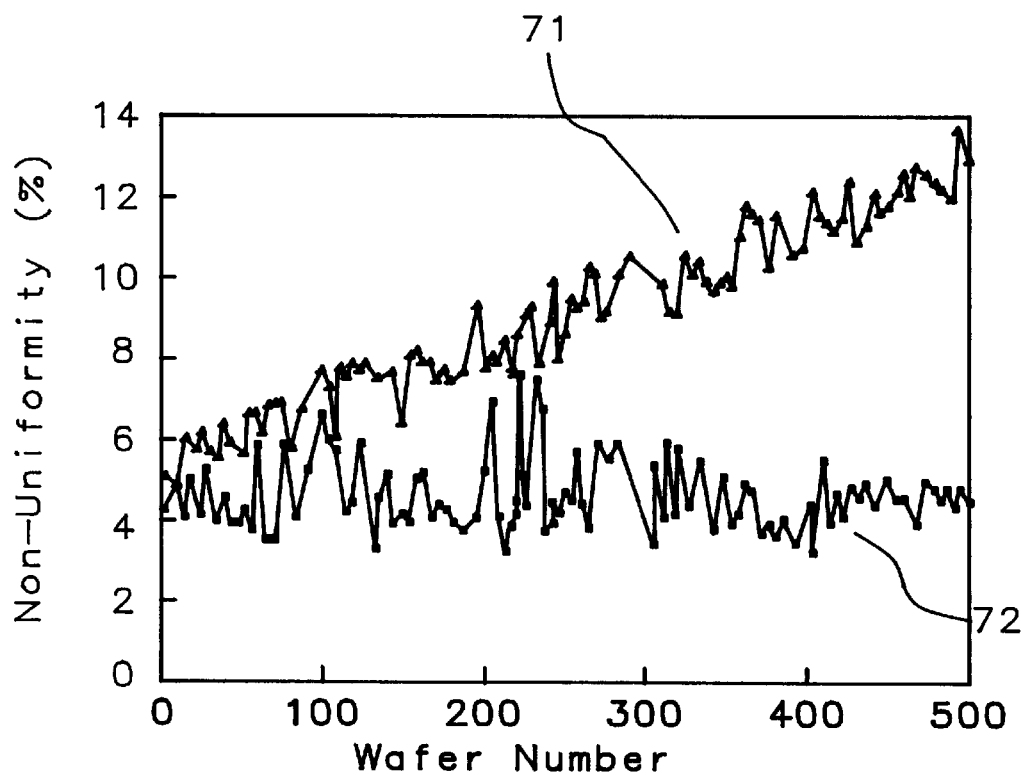
FIG. 7 shows how non uniformity increased when the earlier methodology was used but remained constant when the methodology of the present invention is used.

In addition to the reduction in polishing rate that is corrected by the present invention there is also a problem of increasing non-uniformity associated with pad wear. In general, the material removal rate is not even for all parts of the wafer surface. This is seen in curve 71 shown in FIG. 7. As more and more wafers are polished by a given pad, the percent non-uniformity (as defined above) is seen to steadily increase.

Figure 8A:
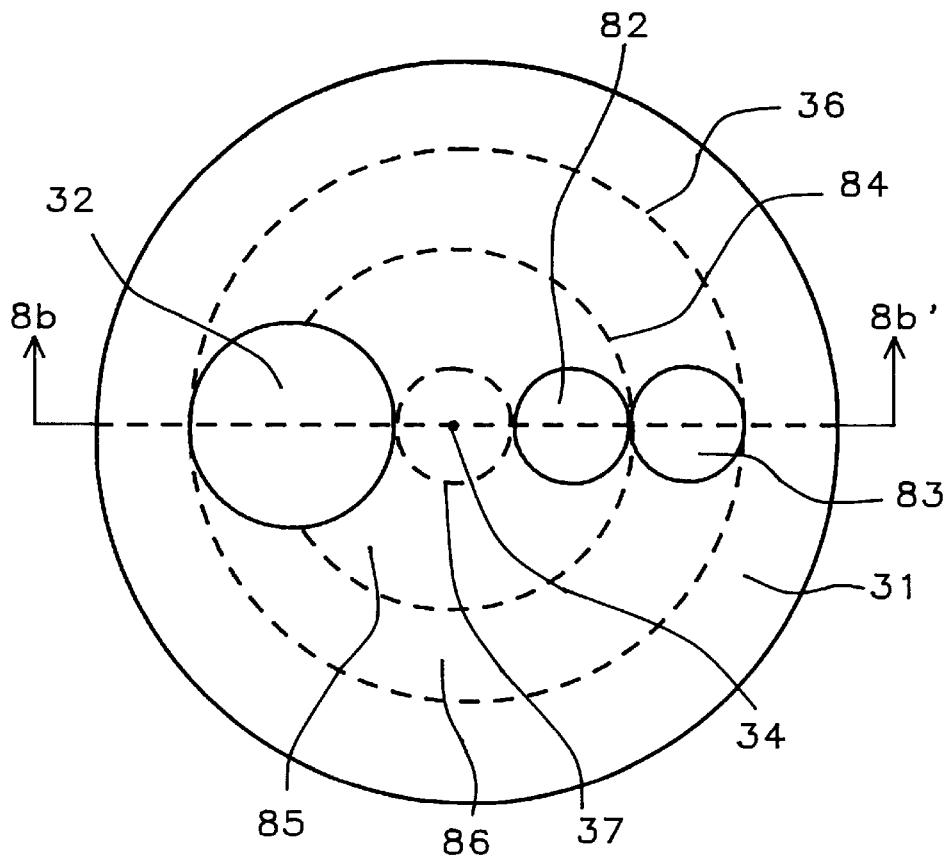
FIG. 8a is a plan view of polishing pad on which are located a silicon wafer and several conditioners.
Figure 8B:
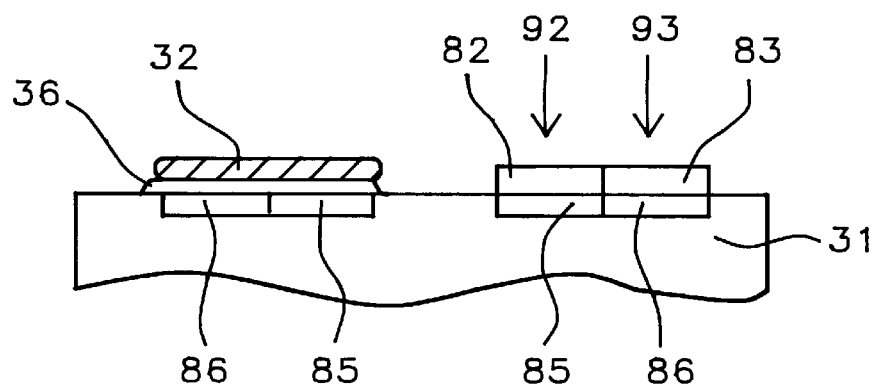

A solution to this problem is presented in the embodiment of our invention that is illustrated in FIGS. 8a and b. As in FIG. 3a, wafer 32 is being polished on pad 31. However, instead of a single diamond wheel conditioner, several are used. Although, for reasons of clarity, we show only two diamond wheels in FIG. 8a, significantly more may be used, up to 5 being quite feasible. FIG. 8b is a cross-section of FIG. 8a made through the line 8b–8b'. Each of the diamond wheels now has its own separate secondary annular area of wear. Thus the secondary area for conditioner 82 is area 85 (bounded by dotted circles 37 and 84) while the secondary area for conditioner 83 is area 86 (bounded by dotted circles 84 and 36). These are both within the primary annular area bounded by circles 36 and 37. By adjusting the pressures of each of the multiple conditioners individually (though feedback of the emissivity values measured in the corresponding secondary annular areas), the rate of material removal during polishing is independently controlled for each secondary annular area. The resulting improvement in the uniformity of material removal is seen in curve 72 of FIG. 7. For that particular example 2 separate conditioners were used.

While the invention has been particularly shown and described with reference to the preferred embodiments thereof, it will be understood by those skilled in the art that various changes in form and details may be made without departing from the spirit and scope of the invention.

What is claimed is:

1. A method for monitoring wear in a top surface of a polishing pad, comprising:

measuring the emissivity of said top surface when said pad is new, thereby obtaining a base value;

measuring the emissivity of said region after the pad has been used, thereby obtaining a wear value;

dividing the wear value by the base value, thereby obtaining a ratio; and establishing an empirical relationship between wear of the top surface and said ratio.

2. The method of claim 1 wherein the step of measuring the emissivity further comprises measuring the non-specular white light reflection and comparing this against a black body.

3. The method of claim 1 wherein the polishing pad is urethane impregnated polyester felt.

4. The method of claim 1 wherein the polishing pad is used for chemical mechanical polishing of silicon wafers.

5. A method for maintaining a constant polishing rate for a succession of substrates, comprising:

providing a polishing pad having a center of rotation and a top surface;

dispensing slurry between a substrate and the pad;

while rotating the pad about said center of rotation, pressing the substrate against the top surface at a location that does not overlie the center of rotation, thereby forming on the top surface an annular region that passes beneath the substrate;

providing means whereby a conditioner is pressed with force against the top surface, said conditioner being located over the annular region;

obtaining an emissivity value for the top surface in the annular region; and using said emissivity value to control said force whereby the force is changed in proportion to changes in the emissivity value.

6. The method of claim 5 wherein the step of measuring the emissivity further comprises measuring the non-specular white light reflection and comparing this against a black body.

7. The method of claim 5 wherein the polishing pad is urethane impregnated polyester felt.

8. The method of claim 5 wherein the polishing pad is used for chemical mechanical polishing of silicon wafers.

9. The method of claim 5 wherein the conditioner is a diamond wheel.

10. The method of claim 5 wherein the force with which the conditioner presses against the upper surface is between 0 and about 10 psi.

11. A method for improving uniformity of material removal from a substrate during polishing, comprising:

providing a polishing pad having a center of rotation and a top surface;

dispensing slurry between a substrate and the pad;

while rotating the pad about said center of rotation, pressing the substrate against the pad at a location that does not overlie the center of rotation, thereby forming on the top surface a primary annular area that passes beneath the substrate;

providing means whereby a plurality of conditioners are pressed, each with an independently controlled force, against said top surface, each conditioner being located within its own secondary annular area within the primary annular area, said secondary annular areas not overlapping each other;

obtaining emissivity values for top surfaces within each secondary annular area; and using said emissivity values to control said forces whereby each force is changed in proportion to changes in the emissivity value measured in its secondary annular area.

12. The method of claim 11 wherein the number of conditioners is between 1 and 5.

13. The method of claim 11 wherein the force with which each conditioner presses against the upper surface is between 0 and about 10 psi.

14. The method of claim 11 wherein the step of measuring the emissivity further comprises measuring the non-specular white light reflection and comparing this against a black body.

15. The method of claim 11 wherein the polishing pad is urethane impregnated polyester felt.

16. The method of claim 11 wherein the polishing pad is used for chemical mechanical polishing of silicon wafers.

* * * * *